(12) United States Patent
Borkar

(10) Patent No.: US 6,266,288 B1
(45) Date of Patent: *Jul. 24, 2001

(54) METHODS FOR REDUCING THE EFFECTS OF POWER SUPPLY DISTRIBUTION RELATED NOISE

(75) Inventor: Shekhar Yeshwant Borkar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/550,008

(22) Filed: Apr. 14, 2000

Related U.S. Application Data

(60) Continuation of application No. 09/360,226, filed on Jul. 23, 1999, now Pat. No. 6,111,804, which is a division of application No. 08/980,998, filed on Dec. 1, 1997, now Pat. No. 6,072,740.

(51) Int. Cl.[7] .................................................... G11C 7/02
(52) U.S. Cl. ............................................ 365/206; 365/226
(58) Field of Search .................................... 365/206, 226

(56) References Cited

U.S. PATENT DOCUMENTS

| 5,455,192 | 10/1995 | Jeon | 437/52 |
| 5,801,412 | 9/1998 | Tobita | 257/206 |
| 5,838,038 | 11/1998 | Takashima et al. | 257/301 |
| 6,111,804 | * 8/2000 | Borkar | 365/206 |

* cited by examiner

Primary Examiner—David Nelms
Assistant Examiner—N. Tran
(74) Attorney, Agent, or Firm—Blakely, Sokoloff, Taylor & Zafman LLP

(57) ABSTRACT

A method is provided for reducing the effects of power supply distribution related noise in an integrated circuit, the integrated circuit having a power supply bus, a ground bus, a DRAM-technology capacitor, and a load circuit The method includes forming the DRAM-technology capacitor adjacent the load circuit, and connecting the DRAM-technology capacitor directly between the supply voltage bus and the ground voltage bus.

9 Claims, 2 Drawing Sheets

METHODS FOR REDUCING THE EFFECTS OF POWER SUPPLY DISTRIBUTION RELATED NOISE

The present application is a continuation of U.S. Ser. No. 09/360,226, filed on Jul. 23, 1999, now U.S. Pat. No. 6,111,804 which is a divisional of U.S. Ser. No. 08/980,998, filed on Dec. 1, 1997, now U.S. Pat. No. 6,072,740.

BACKGROUND OF THE INVENTION

1. Field of the Invention

This invention relates generally to integrated circuits, and, more particularly, to reducing the effects of power supply distribution related noise in integrated circuits.

2. Description of the Related Art

The demand for faster and more powerful personal computers has led to many technological advances in the computer industry, including the development of faster microprocessors and very large scale integration (VLSI) chips. The new generation of microprocessors and VLSI chips generally tend to consume more power than the previous generation.

To reduce the power consumption, logic designers have entertained several options, including reducing the supply voltage $V_{cc}$. The general trend has been to reduce the supply voltage $V_{cc}$ by approximately 30 percent per generation, which has resulted in power savings of approximately 50 percent. However, because the effective switching capacitance and the frequency of operation of the VLSI chip are increasing at a high rate from one generation to another, the net effect has been an increase in the power consumption in the VLSI chip.

While reducing the supply voltage $V_{cc}$ results in power savings, such supply voltage scaling can be done only to a limited extent. This is because the supply voltage scaling does not reduce the supply currents by the same proportion as the power consumption. That is, while the power consumption is reduced quadratically, the supply current is reduced only linearly. As a result, the parasitic effects of resistances and inductances, in the circuit worsen, thereby increasing the power supply distribution related noise. The power supply distribution related noise is caused by the voltage drops across the resistors and the inductors. Furthermore, the supply voltage scaling reduces the noise margin of the circuits on the VLSI chip, which makes the circuits more susceptible to the power supply distribution related noise.

One method offered by the prior art to reduce the effects of power supply distribution related noise is illustrated in FIG. 1. As shown in FIG. 1, the load circuit 5 is coupled to a power supply grid 10 that is inherently inductive and resistive. Whenever the inductance and the resistance of the power supply grid 10 momentarily impedes the current supplied to the load circuit 5, a decoupling capacitor 15 provides the necessary charge to the load circuit 5. Thus, the decoupling capacitor 15 restores the voltage level required for the proper operation of the load circuit 5. It should be noted that the size of the decoupling capacitor 15 has to be large enough to provide adequate charge (i.e. current) until the power supply to the load circuit 5 is restored.

Generally in VLSI chips, metal-oxide-semiconductor field-effect transistors (MOSFETs) (not shown) are employed as the decoupling capacitors 15 in the logic technology. The MOSFETs consume little space and are able to provide a high amount of capacitance that is capable of storing enough charge to drive the load circuit during the periods the voltage level drops. Specifically, MOSFETs have a thin gate oxide and an insulating material with a relatively high dielectric constant. Thus, at least for today's logic chips, the MOSFETs are capable of serving as adequate decoupling capacitors 15.

While the prior art method of utilizing MOSFETs as decoupling capacitors 15 is adequate for reducing the effects of the power supply distribution related noise, it still suffers from at least one shortcoming. As the future generation of more powerful and faster processors and VLSI chips emerge, a higher amount of capacitance will be necessary to reduce the effects of the power supply distribution related noise. This means that larger-size MOSFETs will be required to serve as decoupling capacitors 15 to achieve the increased demand for capacitance. But larger-size MOSFETs will increase the size of the chips, thereby making the prior art method less cost effective. Thus, what is needed is an effective method of reducing the effects of the power supply distribution related noise that demands very little estate on a chip.

The present invention is directed to overcoming, or at least reducing the effects of, one or more of the problems set forth above.

SUMMARY OF THE INVENTION

In one aspect of the present invention, a method is provided for reducing the effects of power supply distribution related noise in an integrated circuit, the integrated circuit having a power supply bus, a ground bus, a DRAM-technology capacitor, and a load circuit. The method includes forming the DRAM-technology capacitor adjacent the load circuit, and connecting the DRAM-technology capacitor directly between the supply voltage bus and the ground voltage bus.

A method is provided for reducing the effects of power supply distribution related noise in an integrated circuit, the integrated circuit having a power supply bus, a ground bus, a DRAM-technology capacitor, and a non-memory load circuit. The method includes forming the DRAM-technology capacitor adjacent the non-memory load circuit, and connecting the DRAM-technology capacitor directly between the supply voltage bus and the ground voltage bus.

BRIEF DESCRIPTION OF THE DRAWINGS

Other objects and advantages of the invention will become apparent upon reading the following detailed description and upon reference to the drawings in which.

Figure 1:
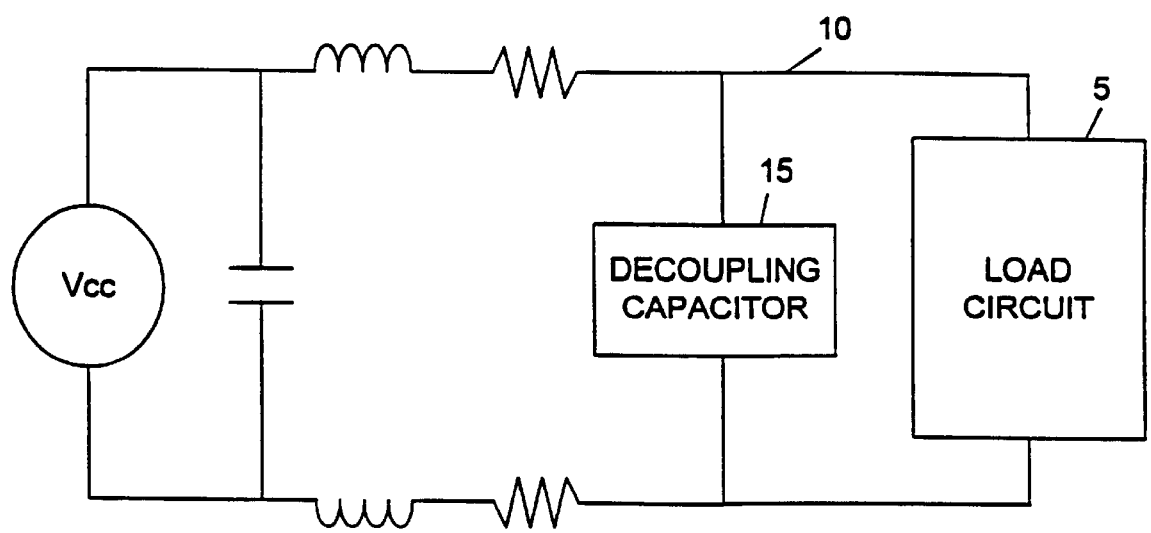
FIG. 1 is a block diagram of a prior art circuit of utilizing a decoupling capacitor to reduce the effects of power supply distribution related noise.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
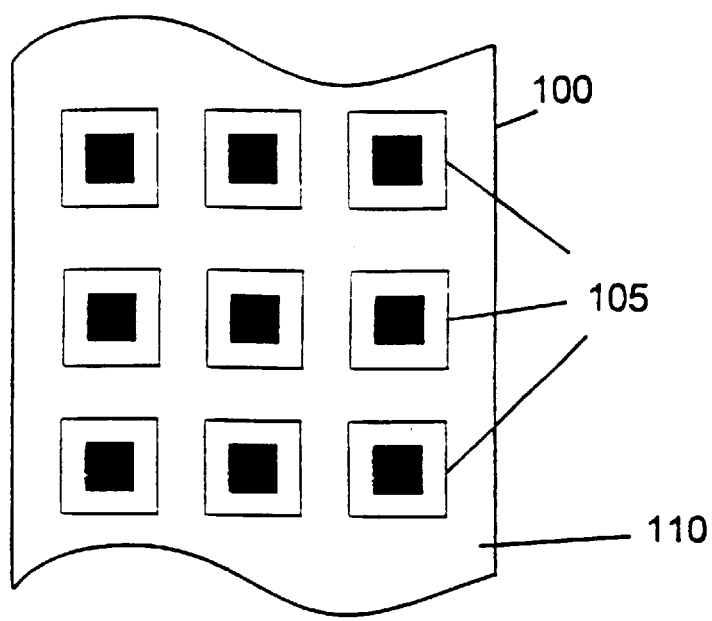
FIG. 2 is a diagrammatic top view of an apparatus in accordance with the present invention of reducing the effects of power supply distribution related noise.

Referring now to the drawings, and in particular to FIG. 2, there is shown a method and apparatus of the present invention for reducing power supply distribution related noise. As shown, FIG. 2 includes a power bus 100 and a plurality of trench capacitors 105 connected in parallel.

The present invention integrates the trench capacitors 105 currently utilized in the DRAM technology into the logic technology. Specifically, in one embodiment of the present invention, the trench capacitors 105 are utilized as decoupling capacitors 15 to reduce the effect of power supply distribution related noise. The trench capacitors 105 provide a very high capacitance per unit area, as compared to the capacitor-equivalent devices (not shown) that are used in logic design. Because the trench capacitors 105 have a high capacitance per unit area and are of relatively small size, they can be effectively utilized as decoupling capacitors 15 for the present, as well as the future, generations of chips.

Another reason the trench capacitors 105 can be effectively implemented as decoupling capacitors 15 on a chip (not shown) is because they can be strategically integrated into the existing circuit layout (not shown) of the chip without having to increase the size of the chip to house these capacitors. That is, the trench capacitors can be placed in an unused circuit space (i.e. spare areas), such as the areas under power/ground busses, the unused area on the silicon, or the like. By occupying space on the chip that would otherwise go unused, the trench capacitors 105 allow logic designers to successfully reduce the effects of power distribution related noise without the increasing the size of the chip.

Figure 3:
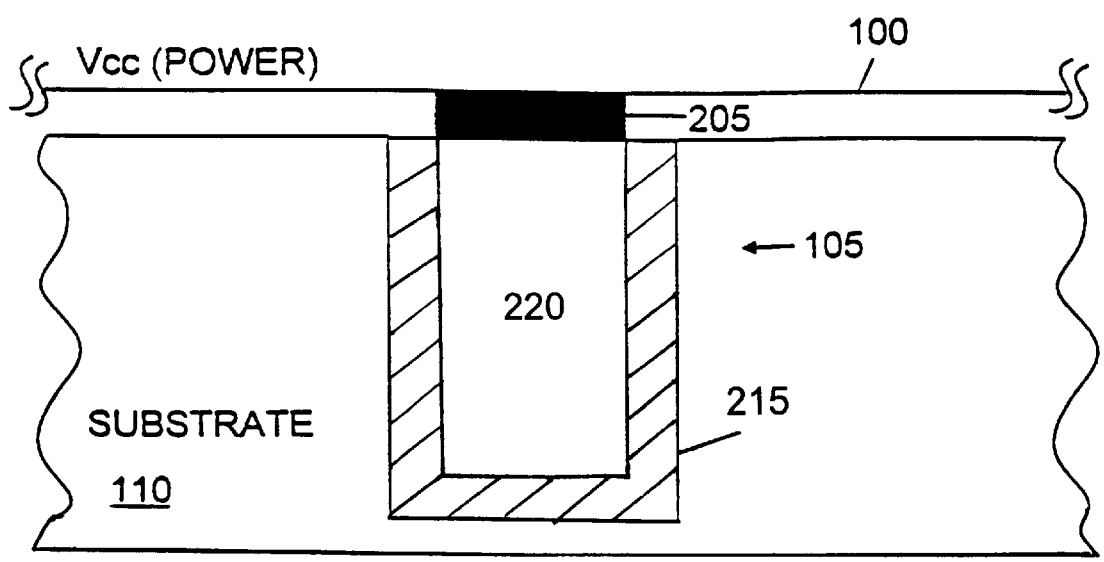
FIG. 3 is an enlarged diagrammatic side view of a trench capacitor utilized in FIG. 2.

FIG. 2 illustrates a plurality of trench capacitors 105 arranged in a parallel configuration under a power bus 100. The trench capacitors 105 are embedded in a substrate 110 underlying the power bus 100, and thus occupy only unused space on a chip. FIG. 3 illustrates an enlarged side view of the trench capacitors 105 of FIG. 2. Each trench capacitor 105 is coupled to the power bus 100. The electrode 205 on the top portion of the trench capacitor 105 makes contact with the power bus 100, while the trench capacitor 105 is etched in the substrate 110, which is typically grounded (i.e. acts as a ground bus).

It should be noted that other DRAM-technology capacitors, such as "stack capacitors" (not shown), can also be utilized in lieu of the "trench capacitors" 105. Like the trench capacitors 105, stack capacitors can also be strategically placed in spare areas of a circuit such that no additional space is needed to house the stack capacitors.

Trench and stack capacitors are formed in a similar manner. Generally, trench capacitors 105 are implemented in a circuit by forming a trench in the silicon 110, placing a dielectric material 215 in the trench, and then covering the dielectric material with conducting material 220, such as polysilicon. Stack capacitors are implemented using a similar technique, where a tower is formed, a dielectric material is placed on the tower, and then covered by conducting material. The methods used to form these DRAM-technology capacitors are conventional, and therefore, have not been described in detail herein. Rather, it should be appreciated that any known method of forming DRAM-technology capacitors, such as trench and stack capacitors, could be readily used to form the decoupling capacitors of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for reducing the effect of power supply distribution related noise in an integrated circuit, the method comprising:

providing an integrated circuit having a power supply bus, a ground voltage bus, and a non-memory load circuit;

forming a DRAM-technology capacitor adjacent the non-memory load circuit; and connecting the DRAM-technology capacitor between the power supply bus and the ground voltage bus.

2. The method of claim 1, wherein the DRAM-technology capacitor comprises a trench capacitor.

3. The method of claim 2, wherein forming the trench capacitor comprises:

forming a trench in a substrate;

placing a dielectric material in the trench; and covering the dielectric material with a conducting material.

4. The method of claim 3, wherein conducting material comprises a polysilicon material.

5. The method of claim 1, wherein the DRAM-technology capacitor comprises a stack capacitor.

6. The method of claim 5, wherein forming the stack capacitor comprises:

forming a tower;

placing a dielectric material on the tower; and covering the dielectric material with a conducting material.

7. The method of claim 6, wherein the conducting material comprises a polysilicon material.

8. The method of claim 1, wherein forming the DRAM-technology capacitor includes forming the DRAM-technology capacitor under the power supply bus.

9. The method of claim 1, further including connecting a plurality of DRAM-technology capacitors between the power supply bus and the ground voltage bus.

* * * * *